(12) United States Patent
Wang et al.

(10) Patent No.: US 10,128,299 B1
(45) Date of Patent: Nov. 13, 2018

(54) MANUFACTURING METHOD OF IMAGE SENSOR INCLUDING SOURCE FOLLOWER CONTACT TO FLOATING DIFFUSION

(71) Applicant: OmniVision Technologies, Inc., Santa Clara, CA (US)

(72) Inventors: Xin Wang, San Jose, CA (US); Dajiang Yang, San Jose, CA (US); Siguang Ma, Mountain View, CA (US); Keiji Mabuchi, Los Altos, CA (US); Bill Phan, San Jose, CA (US); Duli Mao, Sunnyvale, CA (US); Dyson Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/728,893

(22) Filed: Oct. 10, 2017

(51) Int. Cl.
*H01L 27/146* (2006.01)
*H04N 5/378* (2011.01)
*H04N 5/374* (2011.01)

(52) U.S. Cl.
CPC .. *H01L 27/14643* (2013.01); *H01L 27/14689* (2013.01); *H04N 5/374* (2013.01); *H04N 5/378* (2013.01)

(58) Field of Classification Search
None
See application file for complete search history.

(56) References Cited

U.S. PATENT DOCUMENTS 6,867,096 B2   3/2005   Cho et al.

*Primary Examiner* — Duy T Nguyen
*Assistant Examiner* — Bo Bin Jang
(74) *Attorney, Agent, or Firm* — Christensen O'Connor Johnson Kindness PLLC

(57) ABSTRACT

An image sensor includes a photodiode disposed in a first semiconductor material to absorb photons incident on the image sensor and generate image charge. A floating diffusion is disposed in the first semiconductor material and positioned to receive the image charge from the photodiode, and a transfer transistor is coupled between the photodiode and the floating diffusion to transfer the image charge out of the photodiode into floating diffusion in response to a transfer signal. A source follower transistor with a gate terminal is coupled to the floating diffusion to output an amplified signal of the image charge in the floating diffusion. The gate terminal includes a second semiconductor material in contact with the floating diffusion, and a gate oxide is partially disposed between the second semiconductor material and the first semiconductor material. The second semiconductor material extends beyond the lateral bounds of the floating diffusion.

10 Claims, 5 Drawing Sheets

MANUFACTURING METHOD OF IMAGE SENSOR INCLUDING SOURCE FOLLOWER CONTACT TO FLOATING DIFFUSION

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

In CMOS image sensor processes a metal contact may be used to connect the semiconductor wafer and transistor gates. The contacts between various pieces of device architecture are important because the electrical properties of the contact (e.g., if the contact is Ohmic) may dictate device performance. Metal connections may be a source of dark current.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
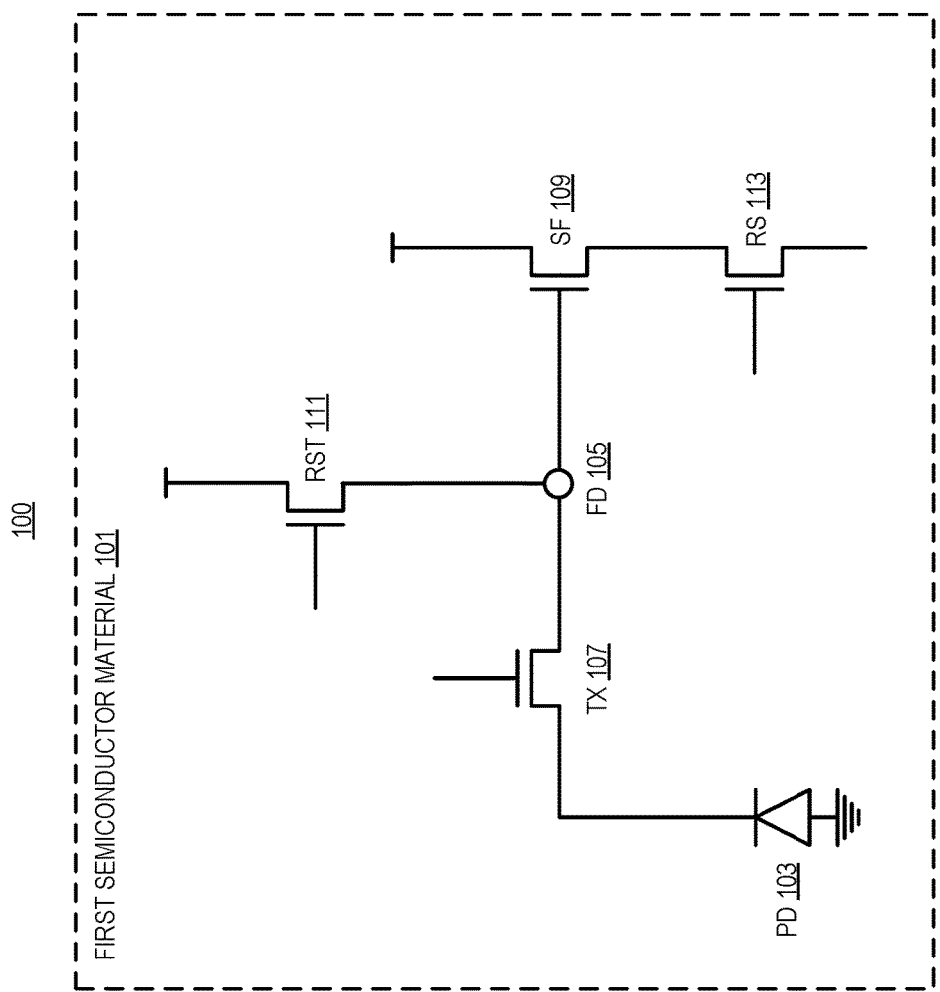
FIG. 1 illustrates an image sensor pixel circuit, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method relating to a source follower contact in an image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

FIG. 1 illustrates an image sensor pixel circuit 100, in accordance with the teachings of the present disclosure. As illustrated, image sensor pixel circuit 100 includes first semiconductor material 101, photodiode 103, floating diffusion 105, transfer transistor 107, source follower transistor 109, reset transistor 111, and row select transistor 113. As shown, photodiode 103 is disposed in first semiconductor material 101, and coupled to transfer transistor 107. Floating diffusion 105 is also coupled to transfer transistor 107 to receive the image charge generated in photodiode 103. Reset transistor 111 is coupled to floating diffusion 105 to reset image charge in floating diffusion 105 after image sensor circuit 100 has readout out the image charge. Source follower transistor 109 is coupled to floating diffusion 105 to amplify image charge in floating diffusion 105, since the gate terminal of source follower 109 is coupled to floating diffusion 105. As will be shown, a gate terminal of source follower transistor 109 may include a metal-free (e.g., semiconductor) extension that contacts floating diffusion 105 directly, so there is only semiconductor material at the source follower transistor 109 floating diffusion 105 interface. A first terminal of row select transistor 113 is coupled to a second terminal of source follower transistor 109 to output image charge from image sensor pixel circuit 100. As will be described in connection with FIG. 2, image sensor circuit 100 may be included in a larger array of photodiodes, in accordance with the teachings of the present disclosure.

Figure 2:
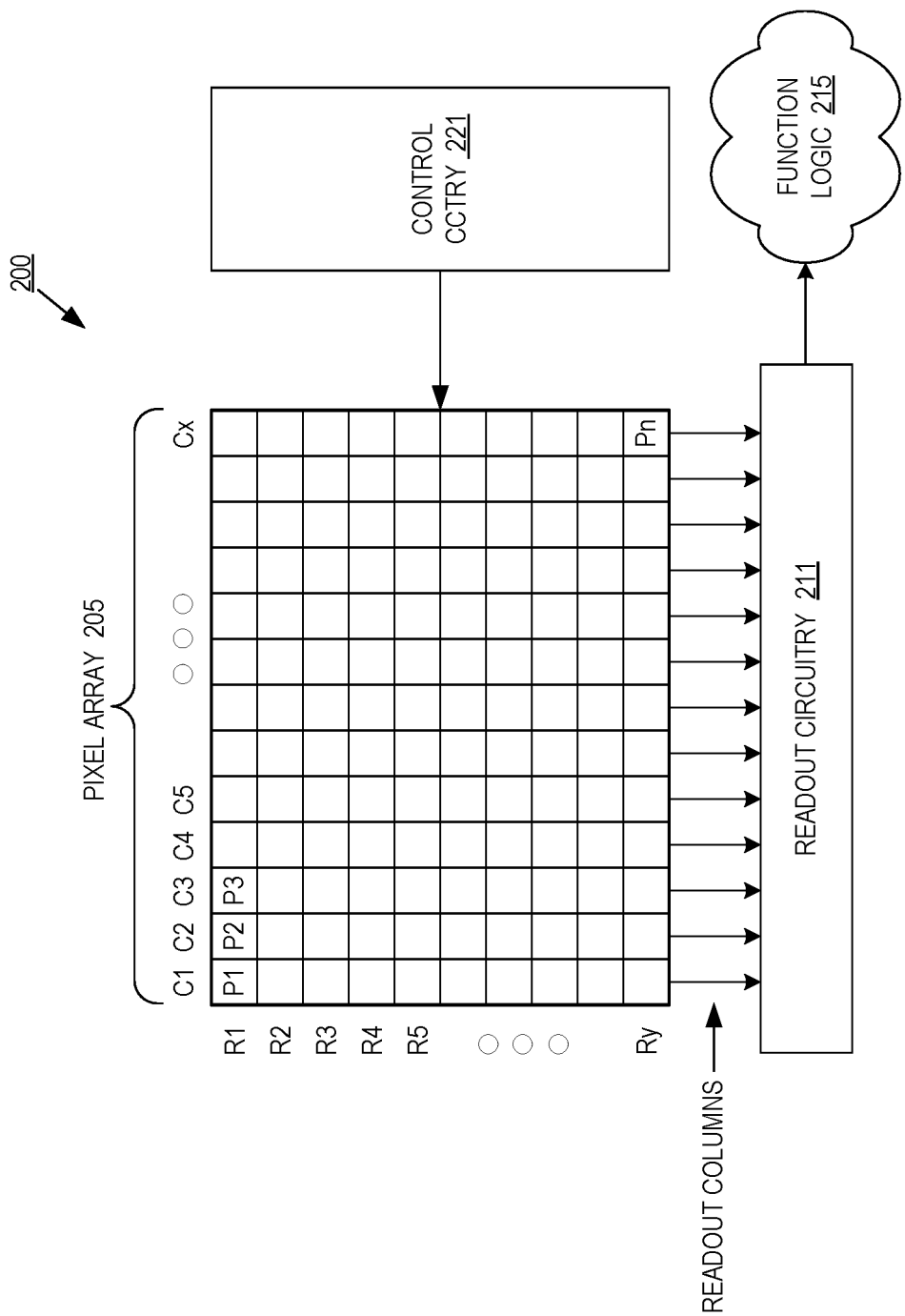
FIG. 2 illustrates a block diagram of one example of an imaging system which may include the circuits of FIG. 1, in accordance with the teachings of the present disclosure.

FIG. 2 illustrates a block diagram of one example of an imaging system 200 which may include the circuits of FIG. 1. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., autofocus, crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
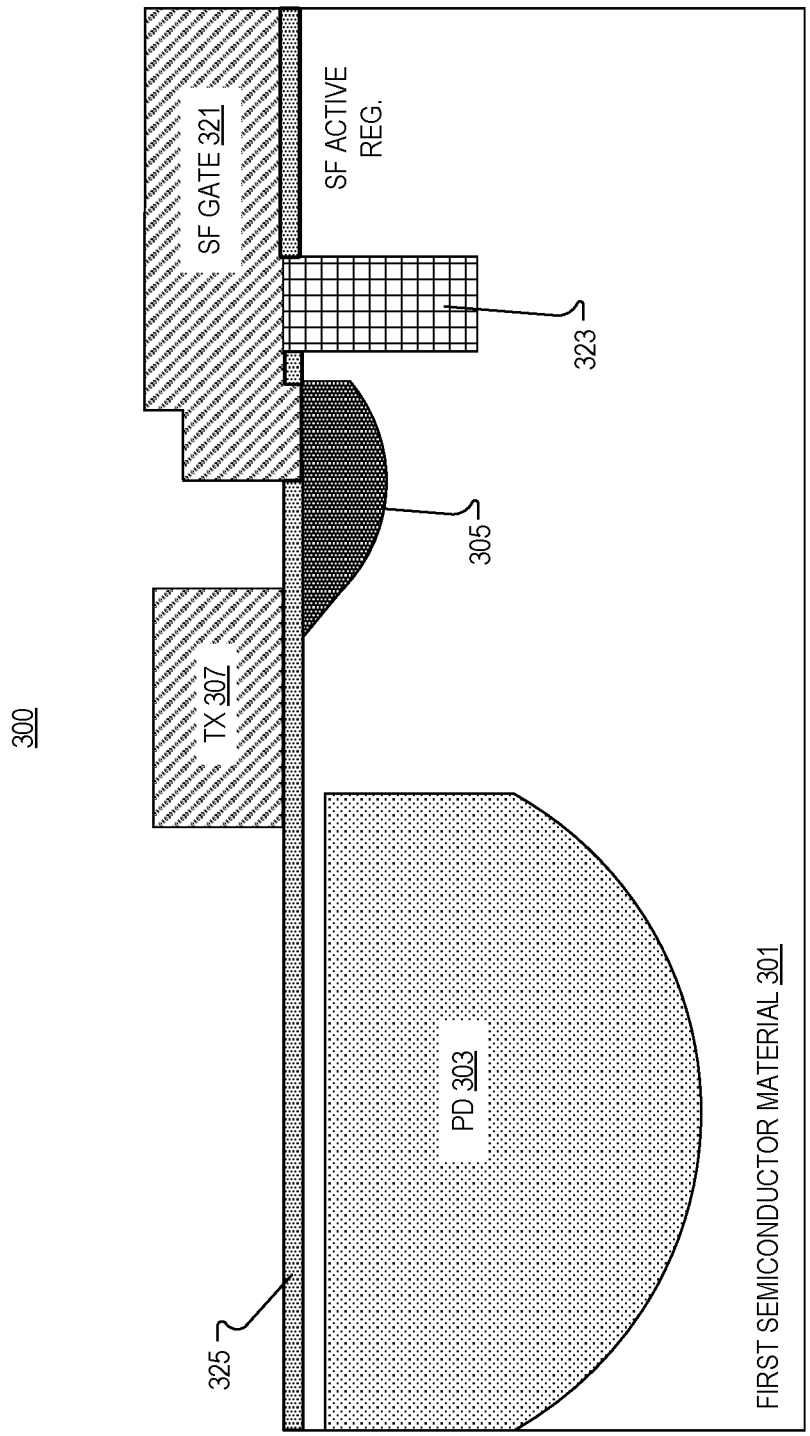
FIG. 3 illustrates an image sensor pixel which may be included in the imaging system of FIG. 2, in accordance with the teachings of the present disclosure.

FIG. 3 illustrates an image sensor pixel 300 which may be included in the imaging system of FIG. 2, in accordance with the teachings of the present disclosure. As shown image sensor pixel 300 includes photodiode 303 disposed in first semiconductor material 301 to absorb photons incident on image sensor 300 and generate image charge. Floating diffusion 305 is disposed in first semiconductor material 301 and positioned to receive the image charge from photodiode 303. Transfer transistor (including—second—gate electrode 307) is coupled between photodiode 303 and floating diffusion 305, both physically and electrically, to transfer the image charge out of photodiode 303 into floating diffusion 305 in response to a transfer signal (applied to gate terminal 307 of the transfer transistor). As shown a first lateral edge of gate terminal 307 is vertically aligned with photodiode 303, and a second lateral edge of gate terminal 307 vertically overlaps floating diffusion 305. Floating diffusion 305 includes dopant implanted into first semiconductor material 301 via ion implantation or the like, and there is a portion that extends linearly into first semiconductor material 301 proximate to photodiode 403 and a rounded portion near the source follower transistor.

Source follower transistor with (first) gate terminal 321 is coupled to floating diffusion 305 to output an amplified signal of the image charge in floating diffusion 305. Gate terminal 321 of source follower transistor includes a second semiconductor material (distinct from first semiconductor material 301—although both first semiconductor material 301 and the second semiconductor material may include the same material composition, e.g., Si) in contact with floating diffusion 305. The portion of second semiconductor material in contact with floating diffusion 305 may be a continuous piece of semiconductor extending from floating diffusion 305 to regions outside of the lateral bounds of floating diffusion 305. There is non-conducting gap between gate terminal 307 and gate terminal 321, and the thickness of the portion of gate terminal 321 connected to floating diffusion 305 is less than the thickness of the rest of gate terminal 321. Gate oxide 325 is disposed between the second semiconductor material and first semiconductor material 301 where the second semiconductor material extends beyond the lateral bounds of floating diffusion 305. Image charge may flow from floating diffusion 305 into gate terminal 321 of the source follower transistor to amplify the signal from floating diffusion 305. However, the source follower transistor's gate terminal 321 is isolated from other pieces of device architecture in first semiconductor material 301 by virtue of gate oxide 325. Gate oxide 325 may include silicon oxide, halfnium oxide, or other metal and/or semiconductor oxides.

In the depicted example, image charge in floating diffusion 305 is transferred to gate terminal 321 of the source follower transistor to create the amplified signal (e.g., an electric field) in first semiconductor material 301. This is because at least part of an active region of the source follower transistor is disposed in first semiconductor material 301, and gate oxide 325 is disposed between the at least part of the active region and the second semiconductor material.

The architecture depicted—where there is no metal connection between floating diffusion 305 and gate terminal 321 of the source follower transistor—presents meaningful advantages over other image sensor architectures that use metal to connect a source follower gate to the floating diffusion, since the illustrated structure reduces dark current that may be caused by metal contacts. Moreover since, in the depicted example, the image sensor operates at low speeds (relative to other integrated circuit applications) parasitic resistance matters less. Accordingly, the device architecture depicted conveys significant advantages over other architectures using metal to connect the floating diffusion and source follower gate.

As illustrated, floating diffusion 305 is laterally disposed in first semiconductor material 301 between photodiode 303 and trench isolation structure 323. Second semiconductor material extends over trench isolation structure 323 (and is in contact with trench isolation structure 323) so that trench isolation structure 323 is disposed between first semiconductor material 301 and the second semiconductor material (e.g., the semiconductor material included in gate terminal 321). In one example, trench isolation structure 323 includes at least one of a metal oxide, semiconductor oxide, semiconductor, or metal. In some examples, a conductive core (e.g., metal or doped semiconductor) may be surrounded by an insulator (e.g., metal oxide or semiconductor oxide) to form trench isolation structure 323. The conductive core may be charged to induce an opposite charge in first semiconductor material 301 to further prevent unwanted charge transfer between pieces of semiconductor device architecture.

In the depicted example, the transfer transistor includes a gate terminal 307 to receive a transfer signal, and both gate terminal 307 and gate terminal 321 include polycrystalline silicon. Both gate terminals 307 and 321 are in contact with gate oxide 325 which is disposed on the frontside surface of first semiconductor material 301. As shown, both gate terminals 307 and 321 have a portion that has the same thickness of polycrystalline silicon (which may include dopant atoms such as boron, phosphorus, arsenic, or the like). Image sensor 300 also includes reset transistor (shown in FIG. 1) coupled to the floating diffusion to reset image charge in the floating diffusion in response to a reset signal.

FIGS. 4A-4E illustrate a method of image sensor 400 fabrication, in accordance with the teachings of the present disclosure. One of ordinary skill in the art having the benefit of the present disclosure will understand that the figures depicted may occur in any order and even in parallel. Additionally, figures can be added to, or removed from, the method in accordance with the teachings of the present disclosure.

Figure 4A:
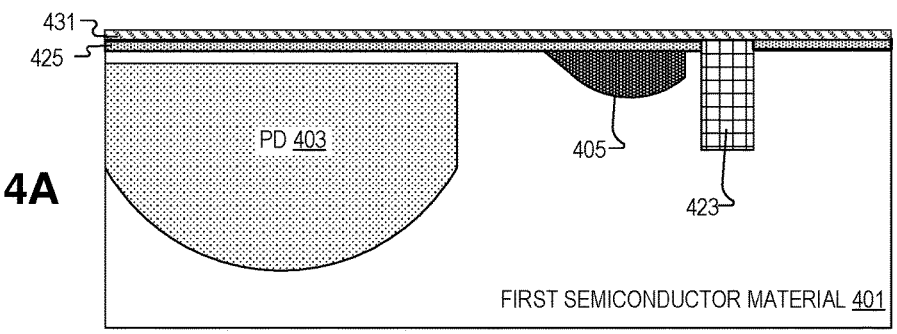
FIGS. 4A-4E illustrate a method of image sensor fabrication, in accordance with the teachings of the present disclosure.

FIG. 4A shows providing first semiconductor material 401 including photodiode 403 and floating diffusion 405 disposed in first semiconductor material 401. FIG. 4A also shows gate oxide 425 disposed on a frontside (which, in subsequent figures, will have the majority of pixel circuitry on it) of first semiconductor material 401. In the depicted example, thin semiconductor material 431 is also disposed on gate oxide 425, so that gate oxide 425 is disposed between first semiconductor material 401 and thin semiconductor material 431. Thin semiconductor material 431 may also include polycrystalline silicon or other semiconductor materials.

In one example, at least part of an active region of the source follower transistor may be formed in first semiconductor material 401 by ion implantation or the like. For example, a doped region of first semiconductor material 401 may be used as the active region of source follower transistor.

As shown, shallow trench isolation structure 423 may also be formed in first semiconductor material 401 to electrically isolate the various pieces of microelectronic circuitry in first semiconductor material 401. In the illustrated example, floating diffusion 405 is laterally disposed between trench isolation structure 423 and photodiode 403. Trench isolation structure 423 may be formed by etching a trench in first semiconductor material 401, and backfilling the trench with at least one of a metal oxide, semiconductor oxide, semiconductor, or metal.

Figure 4B:
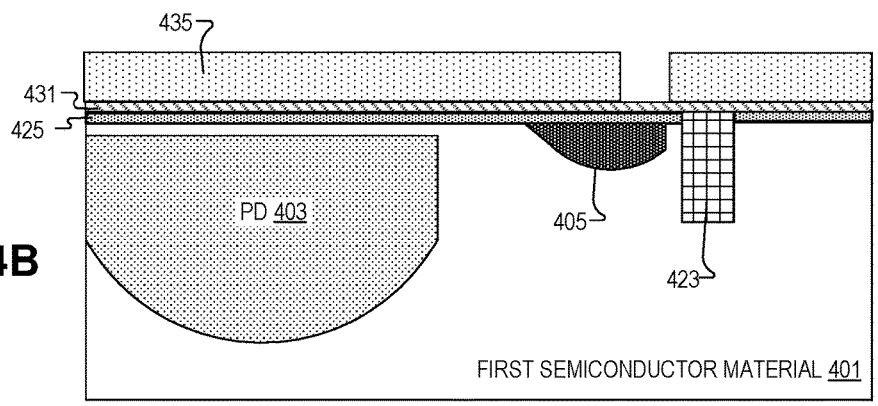

FIG. 4B depicts depositing photoresist layer 435 on the surface of thin semiconductor material 431, so that thin semiconductor material 431 is disposed between gate oxide 425 and photoresist layer 435. As shown part of photoresist layer 435 is removed above floating diffusion 405. In other words, a hole in photoresist layer 435 may be formed that is substantially the same size as the first portion of floating diffusion 405. Thus, a hole of the proper dimension can be etched through gate oxide 425 and thin semiconductor material 431 to provide an exposed electrical contact to floating diffusion 405. Photoresist layer 435 may either be a negative or positive resist. For example, photoresist layer 435 may be hardened with light, and unexposed photoresist above floating diffusion 405 washed away with solvent. Alternatively, the entire photoresist layer may be deposited and hardened/cross-linked, then the portion above floating diffusion 405 is exposed to light to cleave the polymer chains so it can be washed away with solvent or the like.

Figure 4C:
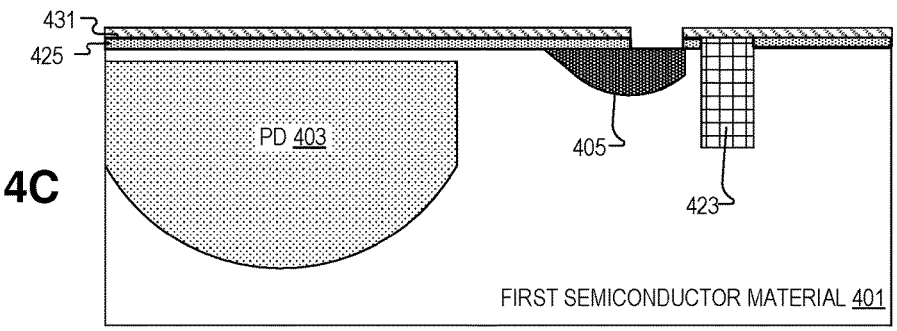

FIG. 4C depicts etching gate oxide 425 to expose a first portion of floating diffusion 405, and also removing photoresist layer 435. In some examples, this may include etching through both the gate oxide 425 and thin semiconductor material 431 with either a wet or dry etch. For example, a dry etch may be used to remove thin semiconductor layer 431, then photoresist layer 435 may be removed. After photoresist layer 435 is removed, a selective wet or dry etch may be used to remove the gate oxide. In this example, thin semiconductor material 431 acts as a mask for the second chemically selective etch step.

Figure 4D:
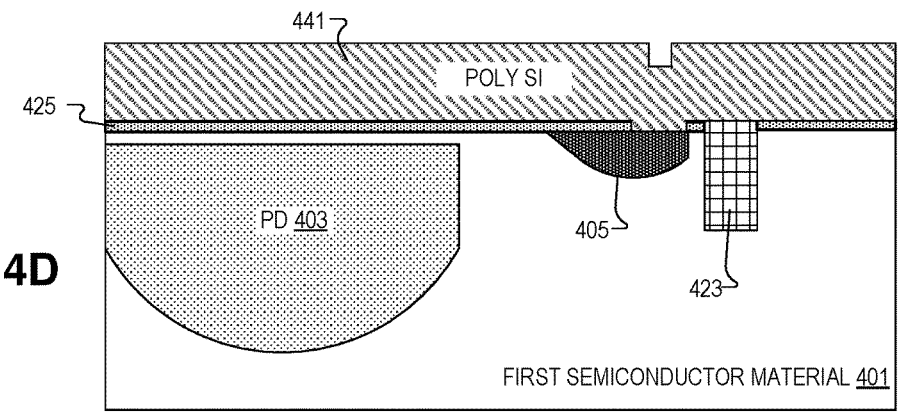

FIG. 4D shows depositing second semiconductor material 441 on the frontside of the device to contact the first portion of floating diffusion 405 that was exposed by the etching steps. FIG. 4D expressly shows not forming a metal connection between floating diffusion 405 and gate terminal of the source follower transistor. In other words, floating diffusion 405 and the gate terminal of source follower transistor are directly connected by semiconductor. As shown, some of gate oxide 425 is disposed between first semiconductor material 401 and second semiconductor material 441. More specifically, gate oxide 425 separates first semiconductor material 401 and second semiconductor material 441 everywhere but on the exposed portion of floating diffusion 405, and above trench isolation structure 423. In the depicted example, second semiconductor material 441 includes polycrystalline silicon, but in other examples may include other semiconductor materials such as germanium, gallium or the like. Alternatively, second semiconductor material 441 may be single crystalline which could be achieved through specific deposition or annealing conditions. Second semiconductor material 441 may be doped in a variety of ways to enhance conductivity.

Figure 4E:
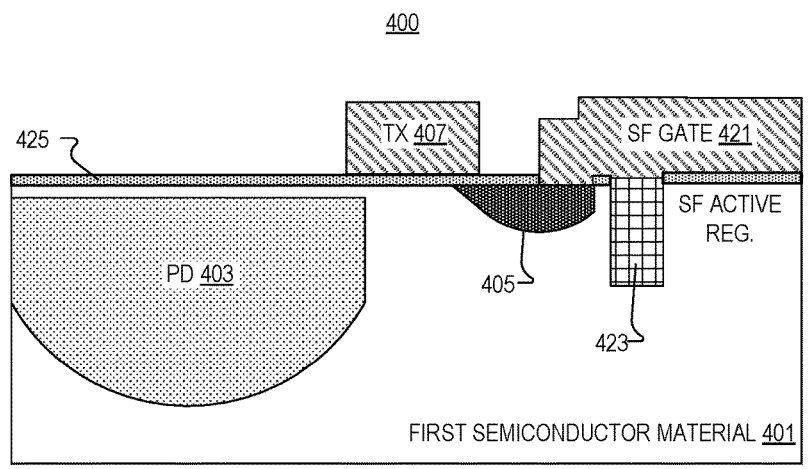

FIG. 4E depicts removing a second portion of the second semiconductor material (e.g., via a wet or dry etch) to form gate terminal 407 of transfer transistor and gate terminal 421 of source follower transistor. Gate terminal 421 includes the second semiconductor material in contact with floating diffusion 405, and part of second semiconductor material may be separated from an active region of source follower transistor by gate oxide 425.

In some examples, a reset transistor may be formed that is coupled to floating diffusion 405 to reset image charge in floating diffusion 405 in response to a reset signal. Similarly, a row select transistor may be formed with a first terminal coupled to a second terminal of the source follower transistor.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, comprising:
providing a first semiconductor material including a photodiode and a floating diffusion disposed in the first semiconductor material, and wherein a gate oxide is disposed on a frontside of the first semiconductor material;
etching the gate oxide to expose a first portion of the floating diffusion;
depositing a second semiconductor material on the frontside to contact the first portion of the floating diffusion, and wherein some of gate oxide is disposed between the first semiconductor material and second semiconductor material; and
removing a second portion of the second semiconductor material to form a gate terminal of a transfer transistor to transfer image charge from the photodiode to the floating diffusion, and to form a gate terminal of a source follower transistor coupled to the floating diffusion to output an amplified signal of the image charge in the floating diffusion, wherein the gate terminal of the source follower transistor includes the second semiconductor material in contact with the floating diffusion.

2. The method of claim 1, further comprising forming at least part of an active region of the source follower transistor in the first semiconductor material, wherein the gate oxide is disposed between the at least part of the active region and the second semiconductor material.

3. The method of claim 1, wherein providing the first semiconductor material further comprises providing a thin semiconductor material on the gate oxide.

4. The method of claim 3, wherein etching the gate oxide includes etching through both the gate oxide and the thin semiconductor material which includes forming a layer of photoresist with a hole in the layer of photoresist substantially the same size as the first portion of the floating diffusion.

5. The method of claim 1, further comprising forming a trench isolation structure in the first semiconductor material, wherein the floating diffusion is laterally disposed between the trench isolation structure and the photodiode.

6. The method of claim 5, wherein forming the trench isolation structure includes:
 etching a trench in the first semiconductor material; and
 backfilling the trench with at least one of a metal oxide, semiconductor oxide, semiconductor, or metal.

7. The method of claim 1, further comprising forming a reset transistor coupled to the floating diffusion to reset the image charge in the floating diffusion in response to a reset signal.

8. The method of claim 1, further comprising forming a row select transistor with a first terminal coupled to a second terminal of the source follower transistor.

9. The method of claim 1, wherein depositing the second semiconductor material includes not forming a metal connection between the floating diffusion and the gate terminal of the source follower transistor.

10. The method of claim 1, wherein the second semiconductor includes polycrystalline silicon.

* * * * *